United States Patent
Manley et al.

(10) Patent No.: US 7,024,600 B2
(45) Date of Patent: Apr. 4, 2006

(54) DIAGNOSIS OF DATA TRANSFER FAULTS USING CONSTRAINTS

(75) Inventors: Douglas R. Manley, Fort Collins, CO (US); Lee A. Barford, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 529 days.

(21) Appl. No.: 10/078,817

(22) Filed: Feb. 19, 2002

(65) Prior Publication Data

US 2003/0159093 A1   Aug. 21, 2003

(51) Int. Cl.
G01R 31/28   (2006.01)

(52) U.S. Cl. .................. 714/712; 714/33; 702/183

(58) Field of Classification Search ............... 714/706, 714/724, 741, 33, 712, 808, 821, 799, 25; 379/10.03; 370/222, 241, 248, 244; 702/183
See application file for complete search history.

(56) References Cited

U.S. PATENT DOCUMENTS

| | | | |
|---|---|---|---|
| 4,462,099 A * | 7/1984 | Braun ..................... 714/706 |
| 4,677,614 A * | 6/1987 | Circo ..................... 370/222 |
| 5,226,111 A | 7/1993 | Black et al. |
| 5,481,548 A * | 1/1996 | Wallace ..................... 714/712 |
| 5,623,499 A * | 4/1997 | Ko et al. ..................... 714/724 |
| 5,668,800 A * | 9/1997 | Stevenson ..................... 370/248 |
| 5,808,919 A | 9/1998 | Preist et al. |
| 5,922,079 A | 7/1999 | Booth et al. |
| 5,946,482 A | 8/1999 | Barford et al. |
| 6,004,027 A * | 12/1999 | Sun et al. ..................... 714/741 |
| 6,011,830 A * | 1/2000 | Sasin et al. ............... 379/10.03 |
| 6,091,712 A * | 7/2000 | Pope et al. ................... 370/244 |
| 6,167,352 A | 12/2000 | Kanevsky et al. |
| 6,249,755 B1 * | 6/2001 | Yemini et al. ............... 702/183 |
| 6,487,593 B1 * | 11/2002 | Banks ......................... 709/224 |
| 6,515,967 B1 * | 2/2003 | Wei et al. ..................... 370/244 |
| 2003/0177416 A1 * | 9/2003 | Manley et al. ................. 714/33 |

OTHER PUBLICATIONS

Manley, et al., "Diagnosis of Data Packet Transfer faults Using Constraints," U.S. Appl. No. 10/099,335, filed Mar. 14, 2002.

* cited by examiner

*Primary Examiner*—Albert DeCady
*Assistant Examiner*—John P. Trimmings

(57) ABSTRACT

Method for diagnosing faults in a system under test (SUT) are provided. A representative method includes identifying at least some portions of the data transmission paths of the SUT capable of introducing errors in data transfer; providing constraints defining relationships of at least some of the portions of the data transmission paths; and diagnosing the SUT with respect to the constraints. Systems, computer-readable media and other methods also are provided.

25 Claims, 5 Drawing Sheets

DIAGNOSIS OF DATA TRANSFER FAULTS USING CONSTRAINTS

FIELD OF THE INVENTION

The present invention generally relates to system fault diagnosis. In particular, the present invention relates to systems and methods that involve the diagnosis of faults in multiple discrete data transfers between portions of a system.

DESCRIPTION OF THE RELATED ART

Various systems and methods have been used for diagnosing faults exhibited by systems under test (SUTs). By way of example, manual diagnosis, automated diagnosis based on test model-based technology, custom software and fault simulation have been used. These techniques, however, tend to exhibit one or more perceived shortcomings that may tend to limit their applicability.

In regard to manual diagnosis, this technique typically is a knowledge-intensive technique that requires a high level of SUT and test suite knowledge. Acquisition of such knowledge by an operator can be time consuming and, therefore, expensive. Additionally, results obtained during diagnosis typically are not repeatable, in that results can vary from operator to operator and/or location to location. Such a technique also can be somewhat error prone, in that improper application of the technique may result in inaccurate fault diagnosis.

Test model-based diagnosis, while considered competent for diagnosing static faults, tends to be ineffective for use in diagnosing intermittent faults. A static fault is a fault that is present during an entire test and typically affects all data transfers during the test, whereas an intermittent fault typically only affects some of the data transfers. Test model-based techniques tend to indict an entire test path when a fault is diagnosed in relation to that test path, compared to indicting a particular portion(s) and/or component(s) of the test path. Additionally, test model-based diagnosis typically requires the development of a detailed model of the tests for a system. Example of test model-based systems are disclosed in U.S. Pat. No. 5,808,919, issued to Preist, et al., which is incorporated herein by reference, and which is commonly assigned with this disclosure to Agilent Technologies, Inc.

Custom software also has been used to diagnose systems. Unfortunately, custom software typically is written to diagnose only a specific system. This approach tends to be cumbersome and, therefore, expensive to implement.

As is also known, fault simulators can be used in system diagnosis. Fault simulators typically operate by producing a fault dictionary. Fault simulation, however, typically requires a large amount of modeling time and relatively large execution times, particularly when complex circuits are employed by the SUT. Because of this, fault simulation typically is not deemed practical for use in complex commercial applications. Additionally, fault simulation is non-existent or, otherwise, considered impractical for diagnosis of intermittent failures.

Based on the foregoing, it should be appreciated that there is a need for improved systems and methods that address the aforementioned and/or other perceived shortcomings of the prior art.

SUMMARY OF THE INVENTION

The present invention relates to the diagnosis of faults in data transfers of a system under test (SUT). Typically, the invention uses constraints to define relationships among various portions of the SUT that affect data transfer. These constraints then can be evaluated with respect to test results obtained from the SUT.

In some embodiments, a dataflow model is used to identify those portions of an SUT capable of introducing data transfer errors. Constraints then are developed to define data transfer relationships among the portions identified. Thus, when test results corresponding to the SUT are received and a data transfer error(s) is detected, the constraints can be evaluated with respect to the test results using the dataflow model to potentially identify and/or exonerate components and/or subcomponents of the SUT that could have produced the data transfer error(s).

Additionally, in some embodiments, those portions of an SUT capable of counting data, e.g., data packets, and/or capable of performing an operation with respect to the data also can be identified. For instance, such an operation could include replicating (bussing), splitting, combining, dropping and/or routing (switching) data.

Embodiments of the invention may be construed as methods for diagnosing faults in an SUT. In this regard, one such method includes: identifying at least some portions of the data transmission paths of the SUT capable of introducing errors in data transfer; providing constraints defining relationships of at least some of the portions of the data transmission paths; and diagnosing the SUT with respect to the constraints.

Another such method includes: providing a dataflow model representative of the SUT, the dataflow model including information corresponding to a relationship of error detection capabilities of the SUT; and diagnosing the SUT with respect to the dataflow model.

Embodiments of the invention also may be construed as systems for diagnosing faults in a system under test (SUT). One such system includes a dataflow model and a reasoning engine. The dataflow model is representative of data transfer capabilities of the SUT. The reasoning engine is adapted to evaluate test results corresponding to the SUT in relation to the dataflow model.

Another system for diagnosing faults incorporates means for receiving test results corresponding at least some components of the SUT and means for diagnosing the SUT with respect to conservation of data flow among the at least some components.

Still other embodiments of the invention may be construed as diagnosis systems, at least some of which can be stored on computer-readable media. One such diagnosis system includes logic configured to identify at least some portions of the data transmission paths of the SUT capable of introducing errors in data transfer; logic configured to provide constraints defining relationships of at least some of the portions of the data transmission paths; and logic configured to diagnose the SUT with respect to the constraints.

Other systems, methods, features and/or advantages of the present invention will be or may become apparent to one with skill in the art upon examination of the following drawings and detailed description. It is intended that all such additional systems, methods, features and/or advantages be included within this description, be within the scope of the present invention, and be protected by the accompanying claims.

BRIEF DESCRIPTION OF THE DRAWINGS

The present invention, as defined in the claims, can be better understood with reference to the following drawings. The drawings are not necessarily to scale, emphasis instead being placed on clearly illustrating the principles of the present invention.

DETAILED DESCRIPTION

As will be described in greater detail herein, systems and methods of the present invention potentially enable fault diagnoses of systems under test (SUT) that are associated with the transfer of data. In particular, constraints representative of relationships between various portions of data transmission paths of an SUT can be used to infer and/or exonerate fault candidates or portions of the SUT potentially responsible for the detected faults. The constraints can be provided as rules and/or equations, for example, that describe how data is to flow through the SUT. Typically, a dataflow model representative of the error-free behavior of the SUT is used. In such an embodiment, the SUT can be diagnosed using the dataflow model and an associated reasoning engine. In some embodiments, the faults diagnosed can occur in the SUT at-speed and/or can be intermittent.

Figure 1:
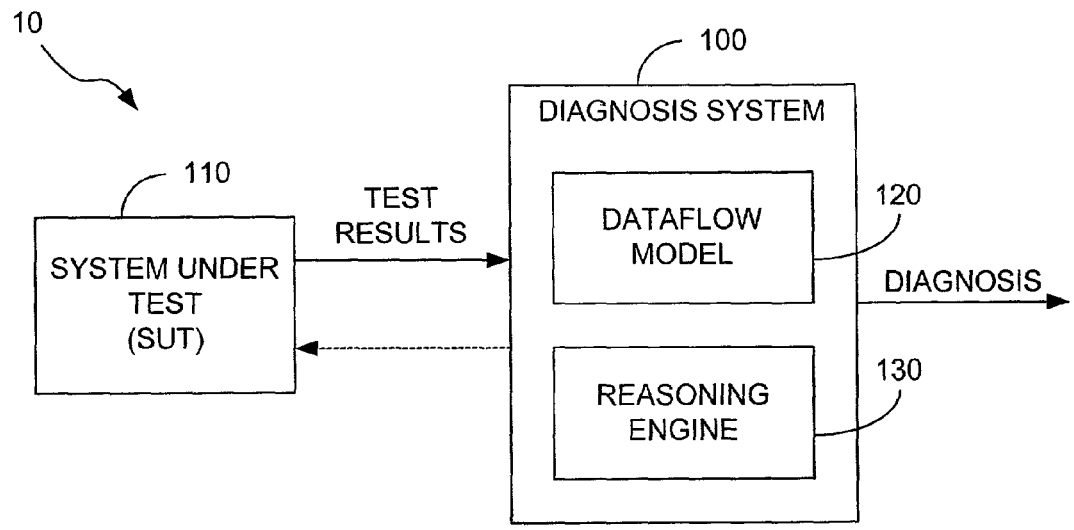
FIG. 1 is a schematic diagram depicting an embodiment of a system of the present invention that includes an embodiment of a diagnosis system being employed to test a system under test.

Referring now to the drawings, wherein like reference numerals indicate corresponding components throughout the several views, FIG. 1 is a schematic diagram depicting an embodiment of a system 10 of the present invention. More specifically, system 10 includes a diagnosis system 100 that communicates with an SUT 110. Diagnosis system 100 incorporates a dataflow model 120 and a reasoning engine 130. The dataflow model 120 describes the flow(s) of data associated with SUT 110 and the reasoning engine 130 interprets test results relative to the dataflow model as will be described in detail later. Preferably, an output diagnosis of the diagnosis system 100 includes an indication of a component(s) and/or subcomponent(s), the failure of which could have resulted in the observed test results.

Figure 2:
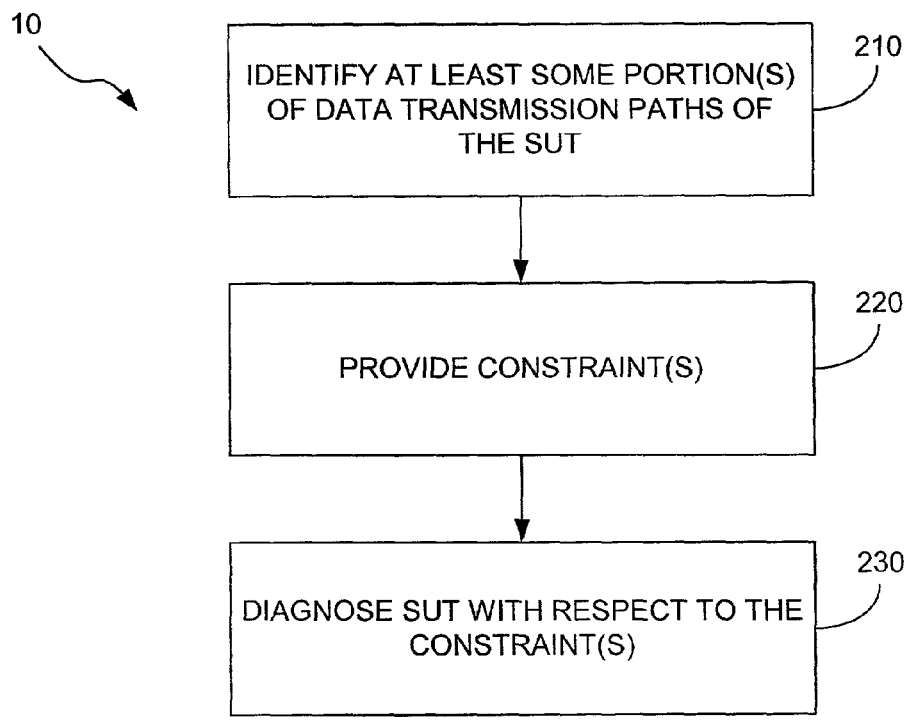
FIG. 2 is a flowchart depicting functionality of an embodiment of the diagnosis system of the present invention.

A flowchart depicting functionality of an embodiment of system 10 of the present invention is depicted in FIG. 2. As shown in FIG. 2, system or method 10 may be construed as beginning at block 210, where at least some portions of data transmission paths of an SUT are identified. More specifically, the identified portions of the SUT can be capable of introducing errors in data transfer. In block 220, constraints defining relationships of at least some of the portions of the data transmission paths are provided. Thereafter, such as depicted in block 230, the SUT is diagnosed with respect to the constraints.

Diagnosis systems 100 can be implemented in software, firmware, hardware, or a combination thereof. When implemented in hardware, diagnosis system 100 can be implemented with any or a combination of various technologies. By way of example, the following technologies, which are each well known in the art, can be used: a discrete logic circuit(s) having logic gates for implementing logic functions upon data signals, an application specific integrated circuit (ASIC) having appropriate combinational logic gates, a programmable gate array(s) (PGA), and a field programmable gate array (FPGA).

When implemented in software, diagnosis system 100 can be a program that is executable by a computer or processor-based device. An example of such a computer or processor-based device will now be described with reference to the schematic diagram of FIG. 3.

Figure 3:
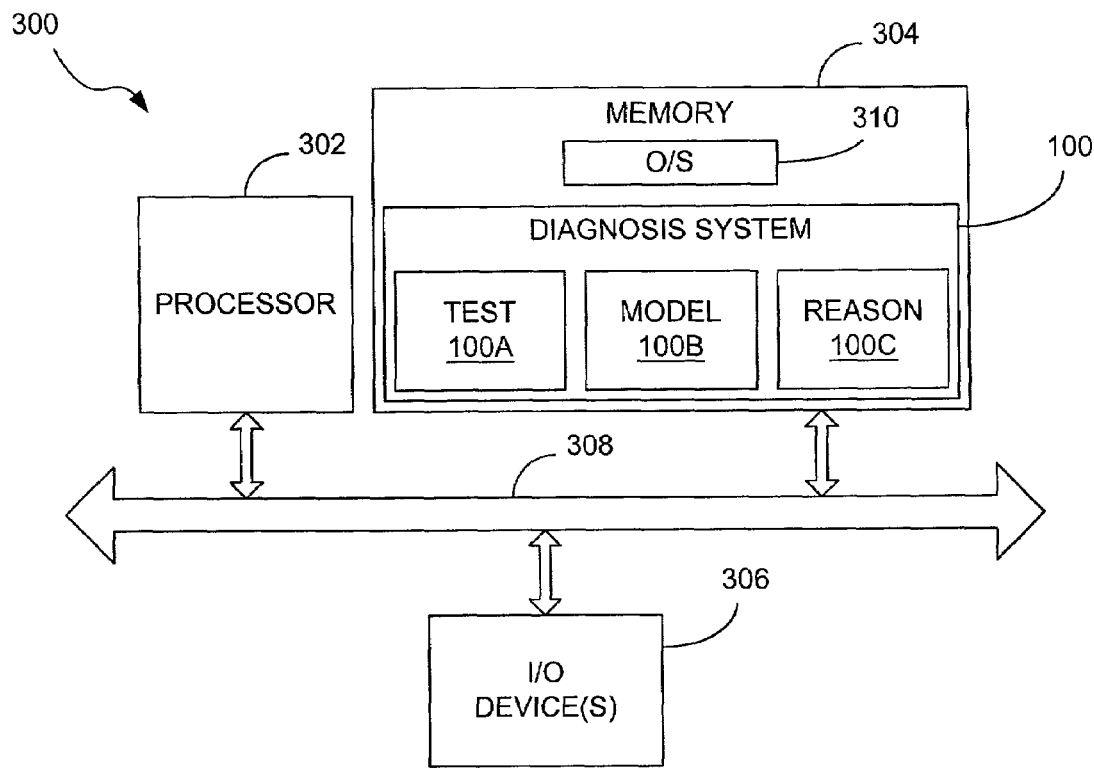
FIG. 3 is a computer or processor-based system that can be used to implement an embodiment of the diagnosis system of the present invention.

Generally, in terms of hardware architecture, computer 300 of FIG. 3 includes a processor 302, memory 304, and one or more input and/or output (I/O) devices 306 (or peripherals) that are communicatively coupled via a local interface 308. Local interface 308 can be, for example, one or more buses or other wired or wireless connections, as is known in the art. Local interface 308 can include additional elements, which are omitted for ease of description. These additional elements can be controllers, buffers (caches), drivers, repeaters, and/or receivers, for example. Further, the local interface may include address, control, and/or data connections to enable appropriate communications among the components of computer 300.

Processor 302 can be a hardware device configured to execute software that can be stored in memory 304. Processor 302 can be any custom made or commercially available processor, a central processing unit (CPU) or an auxiliary processor among several processors. Additionally, the processor can be a semiconductor-based microprocessor (in the form of a microchip), for example.

Memory 304 can include any combination of volatile memory elements (e.g., random access memory (RAM, such as DRAM, SRAM, etc.)) and/or nonvolatile memory elements (e.g., ROM, hard drive, tape, CDROM, etc.). Moreover, memory 304 can incorporate electronic, magnetic, optical, and/or other types of storage media. Note that memory 304 can have a distributed architecture, where various components are situated remote from one another, but can be accessed by processor 302.

The software in memory 304 can include one or more separate programs, each of which comprises an ordered listing of executable instructions for implementing logical functions. The software in the memory 304 includes diagnosis system 100 and a suitable operating system (O/S) 310. Note, diagnosis system may exhibit one or more of various functions, such as testing 100A, modeling 100B and reasoning 100C, which will be described later. In some embodiments, one or more of these functions may be provided as separate programs. The operating system 310 controls the execution of other computer programs, such as diagnosis system 100. Operating system 310 also can provide scheduling, input-output control, file and data management, memory management, and communication control and related services.

The I/O device(s) 306 can include input devices, such as a keypad, for example. I/O device(s) 306 also can include output devices, such as a display device, for example. I/O device(s) 306 may further include devices that are configured to communicate both inputs and outputs, such as a communication port, for example.

When the computer 300 is in operation, processor 302 is configured to execute software stored within the memory 304, communicate data to and from the memory 304, and generally control operations of the computer. Diagnosis system 100 and the O/S 310, in whole or in part, are read by the processor 302, perhaps buffered within processor 302, and then executed.

When diagnosis system 100 is implemented in software, it should be noted that the diagnosis system can be stored on any computer-readable medium for use by or in connection with any computer-related system or method. In the context of this document, a computer-readable medium is an electronic, magnetic, optical, or other physical device or means that can contain or store a computer program for use by or in connection with a computer-related system or method. Diagnosis system 100 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

As used herein, a computer-readable medium can be any means that can store, communicate, propagate or transport a program for use by or in connection with an instruction execution system, apparatus, or device. Thus, a computer readable medium can be, for example but not limited to, an electronic, magnetic, optical, electromagnetic, infrared, or semiconductor system, apparatus, device, or propagation medium. More specific examples (a nonexhaustive list) of a computer-readable medium include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program could be electronically captured, via optical scanning of the paper or other medium, then compiled, interpreted or otherwise processed in a suitable manner, if necessary, and then stored in a computer memory.

Reference will now be made to the flowchart of FIG. 4, which depicts the functionality of a representative embodiment of diagnosis system 100. In this regard, each block of the flowchart represents a module segment or portion of code that comprises one or more executable instructions, or logic for implementing the specified logical function(s). It should also be noted that in some alternative implementations the functions noted in various blocks of FIG. 4, or any other of the accompanying flowcharts, may occur out of the order in which they are depicted. For example, two blocks shown in succession in FIG. 4 may, in fact, be executed substantially concurrently. In other embodiments, the blocks may sometimes be executed in the reverse order depending upon the functionality involved.

Figure 4:
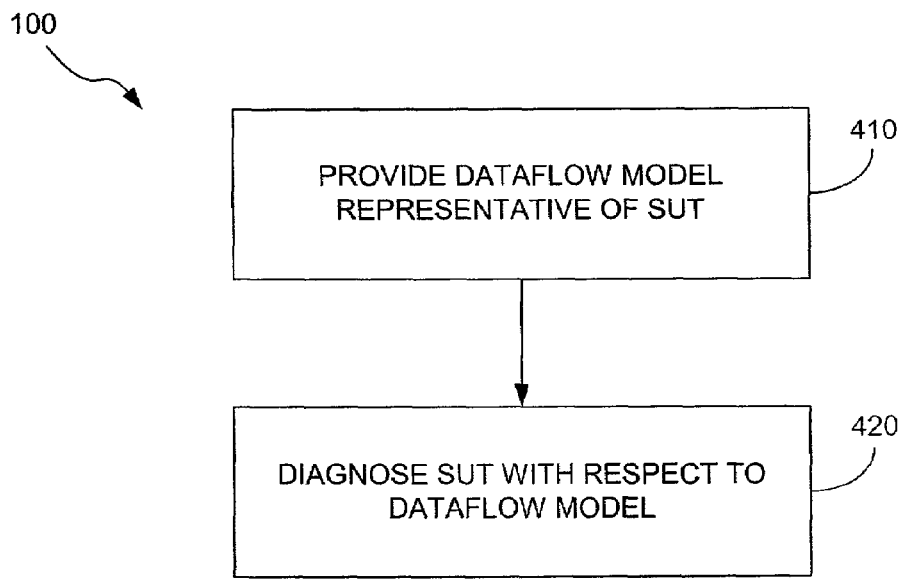
FIG. 4 is a flowchart depicting functionality of the embodiment of the diagnosis system of FIG. 3.

As shown in FIG. 4, the diagnosis system or method 100 may be construed as beginning at block 410, where a dataflow model representative of the SUT is provided. Preferably, the dataflow model includes information corresponding to a relationship of error detection capabilities of the SUT, although various other characteristics can be incorporated as will be described later. In block 420, the SUT is diagnosed with respect to the dataflow model. Typically, this includes acquiring test results, such as by using testing logic (see testing 100A of FIG. 3), and analyzing the test results with a reasoning engine (see reasoning 100C of FIG. 3).

As mentioned before, a dataflow model describes the flow(s) of data among the various components of an SUT. Note, as used herein, the term "data" refers one or more discrete portions of information that are transferred through an SUT. For instance, the data could be configured as data packets.

Preferably, dataflow semantics embodied in a dataflow model are general in nature and can be applied to various systems. Preferably, the dataflow model of a particular SUT is a directed graph that includes vertices and edges. A vertex represents the termination of an edge, i.e., a vertex is used to define an end of an edge. Additionally, a vertex can correspond to a location or portion of a data transmission path where data can be acted upon. For instance, a vertex may correspond to a portion of a data transmission path that drops data, splits data into multiple portions, combines data, routes data and/or replicates data.

Edges represent data transmission paths or portions thereof through an SUT from one vertex to another. More specifically, edges are directional components that are considered opportunities for introduction of data transfer errors. For example, an edge (A, B) represents the conditional transfer of good or bad data, e.g., a data packet from vertex A to vertex B. A self-loop, e.g., (A, A), typically is not permitted.

Error detection capabilities of an SUT represented by a dataflow model also are attributed to edges. Therefore, counters and/or other components capable of tracking data transfers usually are associated with one or more edges of a dataflow model. Note, tracking of data can include tracking data of a type(s) other than good and bad. Thus, embodiments of the invention may be adapted to account for other characteristics of data depending upon the particular application.

With respect to an SUT, error detection capabilities are associated with components that are adapted to perform checks to determine the integrity of data during and/or after operation such as creation, storage, transmission and receipt. Such checks include cyclical redundancy checks (CRC) and message digesting methods, such as MD5. Clearly, this is applicable to those SUTs that incorporate packet-based architectures. For example, in such an SUT, data transmission integrity can be ensured by generating a CRC code at one location of the SUT, recalculating the CRC code at another location, and then comparing the two CRC codes.

By tracking data, such as by using error detection capabilities, a portion or component of an SUT can acquire information regarding whether error-containing data, e.g., a bad data packet, has been received, has or is about to be transmitted, and/or whether bad data has been dropped or propagated downstream. Additionally, in some embodiments, the state of the components(s) and/or a time associated with error detection can be determined.

In some embodiments, the error-logging capability of the SUT is assumed to be perfect. That is, it is typically assumed that the SUT is enabled to log the correct status of incoming data at all edges, under all conditions. This, of course, is false in typical applications but can enable more efficient and higher resolution diagnosis to be performed. Clearly, additional variables could be used in some embodiments, such as to account for imperfect error-logging.

As mentioned before, diagnosis systems of the present invention use constraints to diagnose fault candidates of SUTs. In some embodiments, the constraints can be applied using linear programming. Embodiments of diagnosis systems that employ linear programming to evaluate SUTs typically use constraint equalities and/or inequalities to define data flow relationships according to the functionality of the respective SUTs.

By way of example, linear programming can be used to find a feasible solution given SUT functionality constraints and constraints associated with test, e.g., total number of attempted data, e.g., data packet transmissions and/or constraints associated with observed behavior (test results). In particular, in some embodiments, linear programming can be used to optimize/maximize the number of data packets made bad at each edge.

For instance, assume that a directed graph G=(V,E) modeling the allowable flow of data, e.g., data packets, is provided. A vertex v ∈V of G is a location where measurements may take place, the goodness or badness of packets may be tested, e.g., by checking a CRC code, and/or bad packets may be dropped.

A vertex may be tagged with information about certain behavioral characteristics of the vertex. For instance, a "prop" vertex is a vertex that propagates bad packets and a "noprop" vertex is a vertex that drops any bad packets detected. Let Λ={prop, noprop} be the set of possible vertex tags. Each vertex v∈V has an associated set of tags given by the function T: V→2^Λ. The directed edges E⊆V×V are communications paths between vertices. Without loss of generality, only single direction edges, i.e., edges with only one arrow typically are used. Otherwise, a bi-directional edge can be replaced with two single directional edges. Recall that the edges (j, i)∈E are called the "in-edges" of i, and that the edges (i,j)∈E are called the "out-edges" of i.

The following semantics of edges typically are assumed: a packet that flows into a vertex v from any of its in-edges may flow out any out-edge. If a system or test is known to restrict the flow of packets that enter a vertex at a particular edge or edges to exit out of other particular edge or edges, then the vertex should be broken into two or more vertices. A vertex is called a source if it has no in-edges. It is called a sink if it has no out-edges.

In addition to the graph G, it its assumed that there is a set of counters Ψ and a map M: E×{t, r}×{good, bad}Ψ. The map M gives the semantics of the counters. It should be interpreted as follows:

Suppose M ((i, j), t, good)=ψ. The counter ψ is incremented whenever a good packet is transmitted from vertex i onto edge (i, j).

Suppose M ((i, j), t, bad)=ψ. Then ψ is incremented whenever a bad packet is transmitted from vertex i onto edge (i, j).

Suppose M ((i, j), r, good)=ψ. Then ψ is incremented whenever a good packet is received by vertex j via edge (i, j).

Suppose M ((i, j), r, bad)=ψ. Then ψ is incremented whenever a bad packet is received from vertex j via edge (i, j).

Note that a map M should be onto but may not be one-to-one. For example, suppose a vertex v has three in-edges (x, v), (y, v) and (z, v). It is desired to have ψ count all good packets arriving at v. Then, set—

$$M(((x, v), r, good))=M(((y, v), r, good))=M(((z, v), r, good))=\psi$$

In like manner, a single counter can be used to count a wide variety of different events taking place at various edges. A set of particular measured values for each counter is called a syndrome.

Embodiments of a reasoning engine employing linear programming generally can be described as incorporating three subsections: (1) constraint extraction, (2) addition of syndrome constraints, and (3) determination of which fault candidates are possible given the constraints and syndrome. Typically, the first subsection can be precomputed for a given SUT. Additionally, only the second and third subsection typically need be re-run for each syndrome.

In regard to constraint extraction, a set of variables $\cup_{(i,j)\in E}$ {g(i,j), b(i,j), mb(i,j)} are created. The variable g(i,j) represents the number of good packets transmitted on edge (i, j). The variable b(i, j) represents the number of bad packets transmitted onto edge (i, j) by vertex i. The variable mb(i, j) represents the number of packets made bad onto edge (i, j), that is packets transmitted as good but received as bad.

Generally, an initially empty set of constraints C is created. For each vertex i that has at least one in-edge and at least one out-edge, add to C from the constraints defined below, one constraint (KG). For each vertex that has at least one out-edge, add to C: a constraint on bad packets, prop vertex (KBP), if prop ∈T(i); or a constraint on bad packets, noprop vertex (KBNP), if prop∉T(i).

The following are representative constraints used for describing the representative data flow relationships.

KG (constraint on good packets):

$$\sum_{(j,i)\in E} g(j, i) - \sum_{(j,i)\in E} mb(j, i) - \sum_{(i,j)\in E} g(i, j) = 0$$

Constraint KG indicates that the number of good packets transmitted to vertex i less the number of packets made bad within i's in-edges must be equal to the number of good packets flowing out of i.

KBP (constraint on bad packets, prop vertex):

$$\sum_{(j,i)\in F} b(j, i) - \sum_{(j,i)\in E} mb(j, i) - \sum_{(i,j)\in E} b(i, j) = 0$$

Constraint KBP indicates that in a prop vertex i, the number of bad packets transmitted to i plus the number of packets made bad within i's in-edges must be equal to the number of packets flowing out of i.

KBNP (constraint on bad packets, noprop vertex):

$$\sum_{(i,j)\in E} b(j, i) = 0$$

Constraint KBNP indicates that no bad packets are transmitted from a nonprop vertex.

Counter constraints also are added to C. For instance, for each counter $\psi \in \Psi$ add a COUNTER constraint to C:

COUNTER (Specify the events that $\psi$ counts):

$$\sum_{M((ij),t,good)=\psi} g(i,j) + \sum_{M((ij),r,good)=\psi} g(i,j) - mb(ij)) +$$

$$\sum_{M((ij),t,bad)=\psi} b(i,j) + \sum_{M((ij),r,bad)=\psi} (b(i,j) + mb(ij)) = \text{counter\_value}(\psi)$$

Note, it also is typically necessary to constrain all variables to be nonnegative, i.e., there are no negative packet flows. Additionally, in some situations, it is desirable to constrain all or some variables to be integers.

Proceeding to the addition of syndrome constraints, a syndrome typically includes values associated with the various counters of an SUT. For each such counter, add an equality to C that specifies the value of the counter. For example, if vertex 17 has a txcrc counter that exhibits value 127 and a good counter that exhibits value 1001, add the constraints txcrc (17)=127 and goodctr(17)=1001. These syndrome constraints are referred to as S.

In regard to determination of possible fault candidates, the task is to determine which fault candidates could possibly have caused the bad packets detected. Preferably, each fault candidate corresponds to exactly one edge (i, j)$\in$E. Each such (i, j) corresponds to a variable mb(i, j).

In this embodiment, since a fault candidate can be faulty if and only if there is a solution to the constraints where the fault candidate caused at least one bad packet, edge (ij) can be faulty if and only if max {mb(i,j)|C,S}$\geq$1. Since the constraints C and S are all linear, this maximization problem is a linear programming (LP) problem.

Various routines can be used for solving LP problems. For instance, there are many library routines, such as lp_solve, that are available for solving LP problems. The source code for lp_solve is incorporated herein by reference. Note, in lp_solve, variables are nonnegative by default, so the variables do not need to be explicitly constrained as nonnegative.

In some applications, it may be desirable to enforce a number of simultaneous failures. For example, due to apriori knowledge or customer preference, a number of simultaneous defective edges may be enforced. Alternatively, following Occam's Razor, suppose it is desired to arrive at a diagnosis with a minimal number of defective edges. Such a diagnosis can be found by attempting first to find a single defective edge that explains the available data. Then, if none exists, then attempt to find a pair of defective edges that explain the available. This process can be continued until a multiple-defect hypothesis is found that explains the syndrome.

Suppose a diagnosis with exactly k simultaneous defects is desired. Then for every F$\subseteq$E, |F|=k, let D(F) be the constraints mb(f)$\geq$1 for f$\in$F and mb(f)=0 for f$\notin$F. F will be a set of k defects that explain the syndrome if and only if C, S, and D(F) have a feasible solution.

Testing whether a feasible solution exists can be done by setting up a linear program with any objective function subject to constraints C, S, and D(F). Any linear programming subroutine should either return an optimum value, in which case the constraints have a feasible solution, or return an indication that the linear program is infeasible, in which case C, S, and D(F) are not simultaneously satisfiable, i.e., the simultaneous failures F do not explain the measured syndrome.

Linear Programming Case 1.

Figure 5:
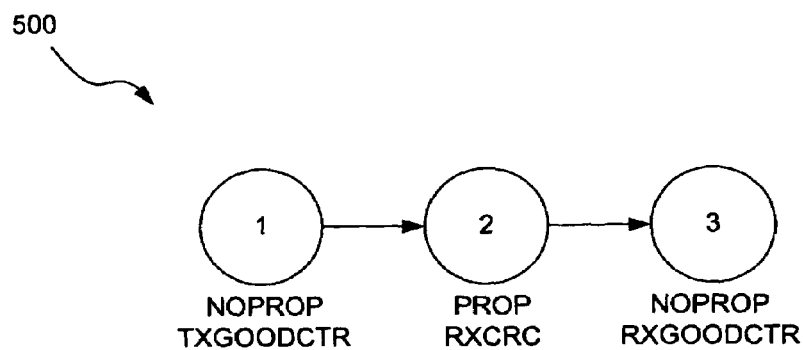
FIG. 5 is a directed graph representative of an embodiment of a dataflow model that can be used by a diagnosis system of the present invention.

Reference will now be made to the dataflow model of FIG. 5. Each vertex, e.g., vertex 1, vertex 2 and vertex 3, exhibits pre-defined behavioral characteristics. In particular, vertex 1 is capable of counting good packets transmitted, vertex 2 is capable of counting bad packets received, and vertex 3 is capable of counting good packets received. Additionally, both vertices 1 and 3 do not propagate received bad packets, and vertex 2 propagates received bad packets.

Based on dataflow model 500, three counters can be used: $\Psi = \{\psi_1, \psi_2, \psi_3\}$. The map M is given by $M((1, 2), t, \text{good}) = \psi_1$ $M((1, 2), r, \text{bad}) = \psi_2$ $M((2, 3), r, \text{good}) = \psi_3$ The constraints C arising from dataflow model 500 are:

$b\_1\_2 = 0$; (KBNP on vertex 1)

$g\_1\_2 - mb\_1\_2 - g\_2\_3 = 0$; (KG on vertex 2)

$b\_1\_2 + mb\_1\_2 - b\_2\_3 = 0$; (KBP on vertex 2)

$g\_1\_2 = psi\_1$; (COUNTER ON $\psi_1$)

$b\_1\_2 + mb\_1\_2 = psi\_2$; (COUNTER on $\psi_2$)

$g\_2\_3 - mb\_2\_3 = psi\_3$; (COUNTER on $\psi_3$)

Assume that, based on acquired test results, vertex 1 counted 20 good packets, vertex 2 counted one CRC error, and vertex 3 counted 19 good packets. The constraints S arising from this syndrome are:

$psi\_1 = 20$ $psi\_2 = 1$ $psi\_3 = 19$

The inequalities to solve in order to perform the diagnosis are:

1. max {mb_1_2|C, S}$\geq$if and only if edge (1, 2) can be faulty; and 2. max {mb_2_3|C, S}$\geq$if and only if edge (2, 3) can be faulty.

The optimum values of the linear programs are:

max $\{mb\_1\_2|C, S\} = 1$; and max $\{mb\_2\_3|C, S\} = 0$

Hence, the edge (1, 2) is defective.

Linear Programming Case 2.

Figure 6:
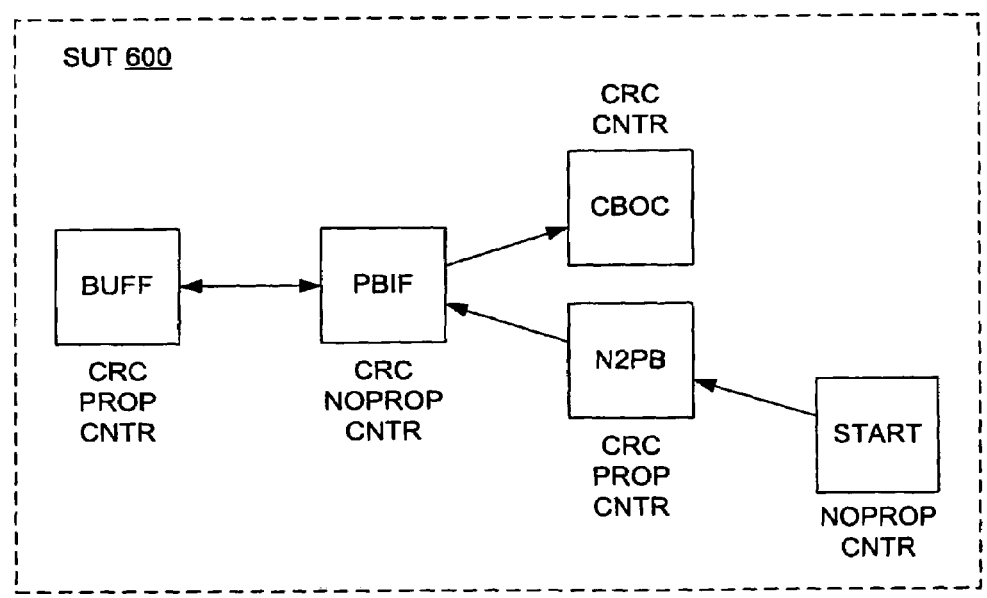
FIG. 6 is a block diagram depicting a representative system under test (SUT).

Reference will now be made FIG. 6, which depicts a block diagram of a representative SUT. As shown in FIG. 6, SUT 600 includes five components, i.e., START, N2PB, PBIF, BUFF, and CBOC. Each component exhibits pre-defined behavioral characteristics. In particular, each of the depicted components of SUT 600 is capable of counting received data, e.g., data packets, and performing CRC checks. Additionally, it should be noted that several of the components perform differently with respect to each other when receiving bad data. More specifically, both N2PB and BUFF propagate received bad data, and both START and PBIF do not propagate received bad data. Also, there are two different kinds of BUFF units. The "smart buff" counts good packets received, the "dumb buff" does not.

In the "dumb buff" case, four counters can be used: $\Psi=\{\psi_1, \psi_2, \psi_3, \psi_4\}$. The map M is given by:

$M((start, n2pb), t, good)=\psi_1;$ $M((start, n2pb), r, good)=\psi_2;$ $M((n2pb, pbif), r, good)=M((buff, pbif), r, good)=\psi_3;$ and $M((pbif, cboc), r, good)=\psi_4.$ Notice that two different arguments to M map to $\psi_3$. Thus, $\psi_3$ is incremented whenever a good packet is received by pbif on either of its in-edges, as desired. In the smart buff case, an additional counter $\psi_5$ is required and M(pbif, buff), r, good)=$\psi_5$.

Figure 7:
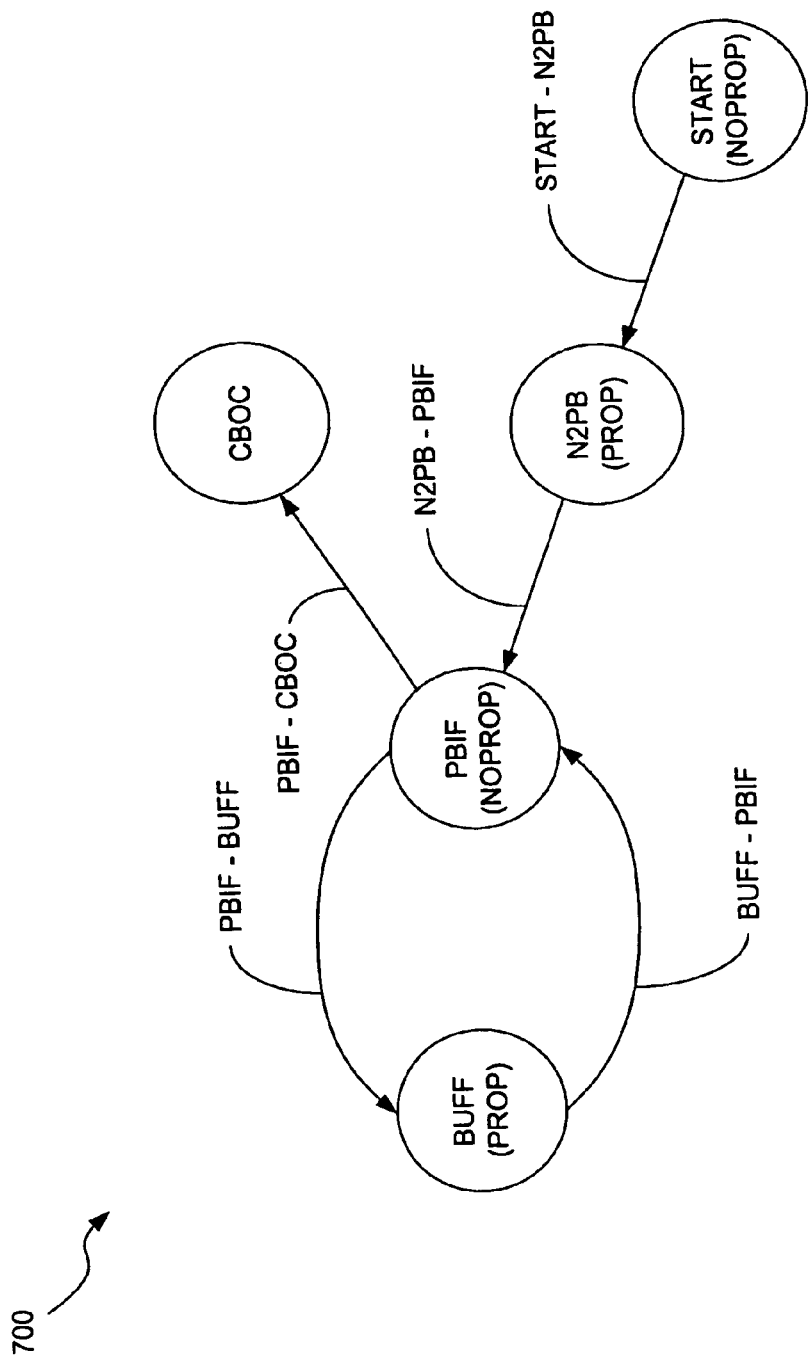
FIG. 7 is a directed graph representative of an embodiment of a dataflow model that can be used by a diagnosis system of the present invention to diagnose the SUT of FIG. 6.

Dataflow model 700 of FIG. 7 can be constructed based on the information presented regarding SUT 600 of FIG. 6. Note that the block diagram of FIG. 6 and the dataflow model 700 of FIG. 7 exhibit dataflow ambiguity. That is, each of the block diagram and the dataflow model 700 does not describe how data actually flows from PBIF to CBOC. In particular, it is ambiguous as to whether data arriving at PBIF first flows to BUFF and back prior to being transferred to CBOC, or whether BUFF is somehow bypassed. Because of this ambiguity, dataflow model 700, which provides direct analogues for the five components of the block diagram of FIG. 6, may be less useful than other dataflow models that do not incorporate such ambiguity. For instance, when information regarding the actual flow of data from PBIF to CBOC is acquired, an unambiguous dataflow model depicting the transfer of data through the SUT can be constructed. An embodiment of such a dataflow model will be described later with respect to FIG. 8.

Referring back to the dataflow model of FIG. 7, five syndromes were created, each of which is a possible syndrome arising from an intermittent failure of one of the five edges in the dataflow model. The syndromes are shown in Table 1.

TABLE 1

Syndromes used in Cases 1 and 2

| Counter | Syn. 1 | Syn. 2 | Syn. 3 | Syn. 4 | Syn. 5 |
|---|---|---|---|---|---|
| defect | start → n2pb | n2pb → pbif | pbif → buff | buff → pbif | pbif → cboc |
| $\psi_1$ | 10 | 10 | 10 | 10 | 10 |
| $\psi_2$ | 9 | 10 | 10 | 10 | 10 |
| $\psi_3$ | 18 | 18 | 19 | 19 | 20 |
| $\psi_4$ | 9 | 9 | 9 | 9 | 9 |
| $\psi_5$ | 9 | 9 | 9 | 10 | 10 |

The results of solving the linear programming problems are shown in Table 2 and Table 3. Recall that a nonzero entry implies that the corresponding fault hypothesis is a feasible failure cause. The value is the number of bad packets attributed to that failure cause.

TABLE 2

Results of LP solving for Case 2, dumb buffer.

| Fault Hypo. | Syn. 1 | Syn. 2 | Syn. 3 | Syn. 4 | Syn. 5 |
|---|---|---|---|---|---|
| start → n2pb | 1 | 0 | 0 | 0 | 0 |
| n2pb → pbif | 0 | 1 | 1 | 1 | 1 |
| pbif → buff | 0 | 1 | 1 | 1 | 1 |
| buff → pbif | 0 | 1 | 1 | 1 | 1 |
| pbif → cboc | 0 | 1 | 1 | 1 | 1 |

TABLE 3

Results of LP solving for Case 2, smart buffer.

| Fault Hypo. | Syn. 1 | Syn. 2 | Syn. 3 | Syn. 4 | Syn. 5 |
|---|---|---|---|---|---|
| start → n2pb | 1 | 0 | 0 | 0 | 0 |
| n2pb → pbif | 0 | 1 | 0 | 1 | 0 |
| pbif → buff | 0 | 0 | 1 | 0 | 1 |
| buff → pbif | 0 | 1 | 0 | 1 | 0 |
| pbif → cboc | 0 | 0 | 1 | 0 | 1 |

Linear Programming Case 3.

In this example, another assumption is added to that described previously in relation to Case 2. In particular, suppose that an additional constraint is known, i.e., that packets must flow from n2pb to pbif to buff to pbif to cboc. Then, a more accurate dataflow model for the SUT can be constructed. Such a dataflow model is depicted in FIG. 8.

Figure 8:
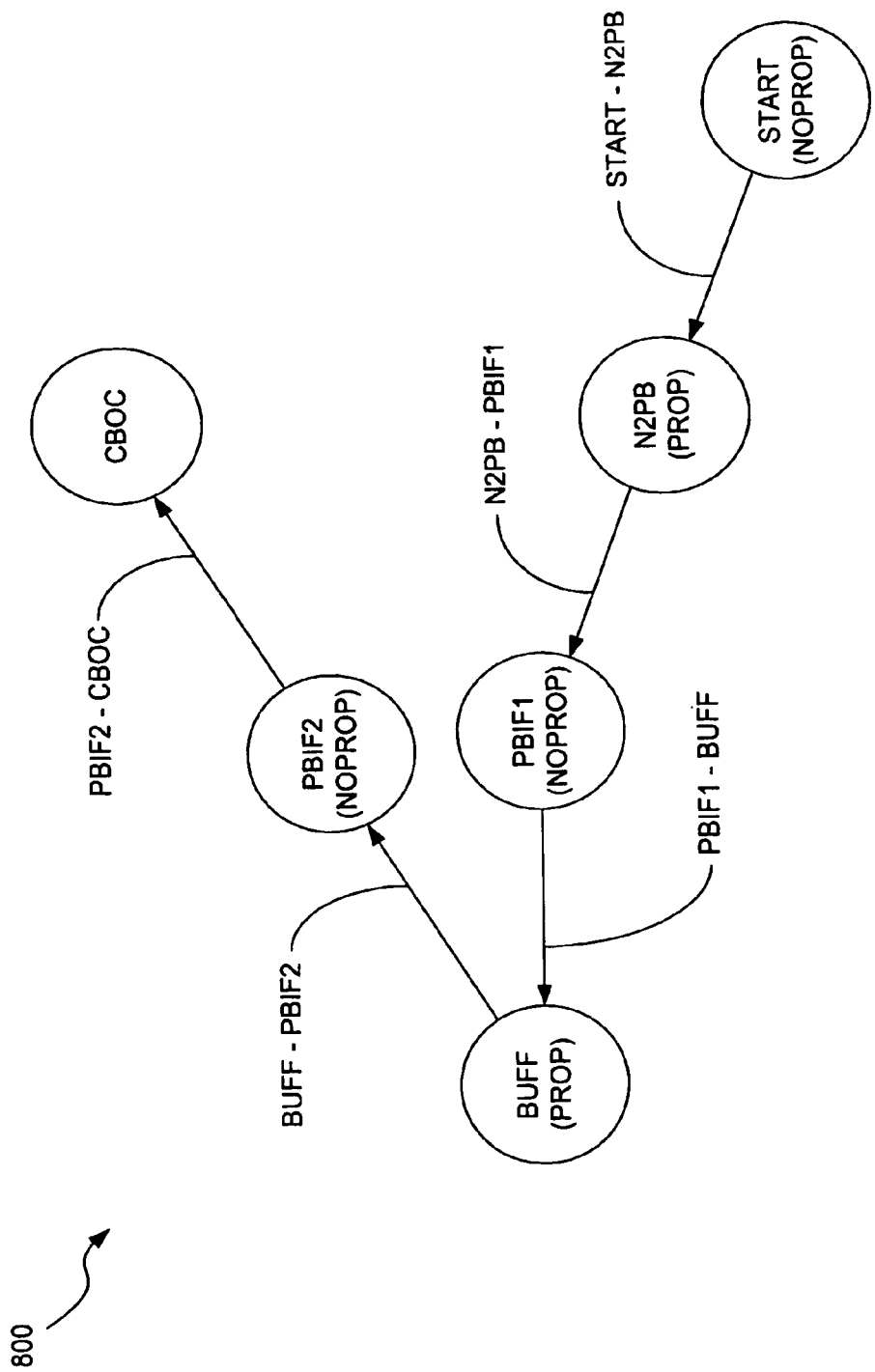
FIG. 8 is another directed graph representative of an embodiment of a dataflow model that can be used by a diagnosis system of the present invention to diagnose the SUT of FIG. 6.

As shown in FIG. 8, dataflow model 800 includes vertices START, N2PB, PBIF1, BUFF, PBIF2 and CBOC. Edges START→N2PB, N2PB→PBIF1, PBIF1→BUFF, BUFF→PBIF2, and PBIF2→CBOC are defined by the vertices. Thus, component PBIF of FIG. 6 has been redefined for the purpose of dataflow model 800 as two distinct vertices, i.e., PBIF1 and PBIF2, thereby removing the dataflow ambiguity.

As in Case 2, four counters can be used: $\Psi=\{\psi_1, \psi_2, \psi_3, \psi_4\}$. The map M is given by:

$M((start, n2pb), t, good)=\psi_1$ $M((start, n2pb), r, good)=\psi_2,$ $M((n2pb, pbif1), r, good)=M((buff, pbif2), r, good)$
$=\psi_3,$ $M((pbij2, cboc), r, good)=\psi_4.$ Note that $\psi_3$ is incremented when a good packet is received by either pbif1 or pbif2. This is because in the original dataflow model of FIG. 7, pbif counts all arriving good packets arriving on either edge.

The constraints C are:

$g\_start\_n2pb-mb\_start\_n2pb-g\_n2pb\_pbif1=0;$ $b\_start\_n2pb+mb\_start\_n2pb-b\_n2pb\_pbif1=0;$ $g\_n2pb\_pbif1-mb\_n2pb\_pbif-g\_pbif1\_buff=0;$ $b\_pbif1-buff=0;$ $g\_pbif1\_buff-mb\_pbif\_buff-g\_buff\_pbif2=0;$ $b\_pbif1\_buff+mb\_pbif\_buff-b\_buff\_pbif2=0;$ $g\_buff\_pbif2-mb\_buff-pbif-g\_pbif2\_cboc=0;$ $b\_pbif2\_cboc=0;$ g_start_n2pb=psi_1;

g_start_n2pb-mb_start_n2pb=psi_2;

g_n2pb_pbif1-mb_n2pb_pbif+g_buff_pbif2-mb_buff_pbif=psi_3;

g_pbif2_cboc-mb_pbif_cboc=psi_4;

The results of solving the LP problems appear in Tables 4 and 5. In this case, variables are additionally constrained to be integers.

TABLE 4

Results of LP solving for Case 3, dumb buffer.

| Fault Hypo. | Syn. 1 | Syn. 2 | Syn. 3 | Syn. 4 | Syn. 5 |
|---|---|---|---|---|---|
| start → n2pb | 1 | 0 | 0 | 0 | 0 |
| n2pb → pbif1 | 0 | 1 | 0 | 0 | 0 |
| pbif1 → buff | 0 | 0 | 1 | 1 | 0 |
| buff → pbif2 | 0 | 0 | 1 | 1 | 0 |
| pbif2 → cboc | 0 | 0 | 0 | 0 | 1 |

TABLE 5

Results of LP solving for Case 3, smart buffer.

| Fault Hypo. | Syn. 1 | Syn. 2 | Syn. 3 | Syn. 4 | Syn. 5 |
|---|---|---|---|---|---|
| start → n2pb | 1 | 0 | 0 | 0 | 0 |
| n2pb → pbif1 | 0 | 1 | 0 | 0 | 0 |
| pbif1 → buff | 0 | 0 | 1 | 0 | 0 |
| buff → pbif2 | 0 | 0 | 0 | 1 | 0 |
| pbif2 → cboc | 0 | 0 | 0 | 0 | 1 |

The foregoing description has been presented for purposes of illustration and description. It is not intended to be exhaustive or to limit the invention to the precise forms disclosed. Modifications and/or variations are possible in light of the above teachings. The embodiments discussed, however, were chosen and described to illustrate the principles of the invention and its practical application to thereby enable one of ordinary skill in the art to utilize the invention in various embodiments and with various modifications as are suited to the particular use contemplated. All such modifications and variations are within the scope of the invention as determined by the appended claims.

The invention claimed is:

1. A method for diagnosing faults in a system under test (SUT), the SUT defining data transmission paths through which data packets are transferred, said method comprising:
   providing a dataflow model corresponding to the error-free behavior of the SUT, the dataflow model including edges, each of the edges corresponding to a portion of one of the data transmission paths of the SUT capable of introducing errors in data transfer;
   identifying portions of the data transmission paths of the SUT capable of introducing errors in data transfer;
   providing constraints defining relationships of at least some of the portions of the data transmission paths identified with respect to data packet flow through the data transmission paths;
   receiving test results corresponding to the SUT; and
   diagnosing the SUT with respect to the constraints by analyzing the test results with respect to the dataflow model, and identifying faulty portions of the data transmission paths.

2. The method of claim 1, wherein the dataflow model includes vertices, each of the edges being defined between two of the vertices.

3. The method of claim 2, wherein each of the vertices is at least one of a termination of an edge and representative of a location where an operation with respect to data can occur.

4. The method of claim 3, wherein the operation corresponding to a vertex includes at least one of dropping data, splitting data, routing data, replicating data and combining data.

5. The method of claim 1, wherein the SUT includes a counter corresponding to at least one of the edges of the dataflow model; and
   further comprising:
   receiving information, corresponding to the test results, from the counter.

6. The method of claim 1, wherein the dataflow model is a directed graph.

7. The method of claim 1, wherein analyzing the test results comprises:
   receiving information corresponding to failed data transfers; and
   identifying portions of the SUT potentially associated with the failed data transfers.

8. The method of claim 7, wherein analyzing the test results comprises:
   exonerating portions of the SUT initially identified as being associated with the failed data transfers if those portions of the SUT are determined not to have initiated at least one of the failed data transfers.

9. The method of claim 1, wherein diagnosing the SUT comprises:
   receiving information regarding data transfers with respect to the portions identified, the information being obtained via cyclic redundancy checking.

10. The method of claim 1, wherein the dataflow model includes vertices, each of the edges being defined between two of the vertices; and
    wherein the constraints correspond to data flow characteristics of the SUT exhibited with respect to the vertices.

11. The method of claim 10, wherein at least one of the constraints of at least one of the vertices relates that an amount of data flowing into the vertex corresponds to an amount of data flowing from the vertex.

12. The method of claim 11, wherein the amount of data flowing into the vertex corresponds to an amount of at least one of: good data, bad data and a particular type of data flowing into the vertex.

13. A method for diagnosing faults in a system under test (SUT), said method comprising:
    providing a dataflow model representative of error-free behavior of the SUT, the dataflow model including information corresponding to a relationship of error detection capabilities of data packet flow through the SUT;
    providing constraints defining relationships of portions of the dataflow model, the constraints comprising equations describing the flow of the data packets through the SUT; and
    diagnosing the SUT with respect to the dataflow model using the constraints and identifying faulty portions of the data transmission paths.

14. The method of claim 13, wherein diagnosing the SUT comprises:
    generating information indicative of a manner of failure of the SUT.

15. The method of claim 14,
wherein diagnosing the SUT further comprises:
analyzing information acquired via cyclic redundancy checks performed at various locations associated with the flow of data.

16. A system for diagnosing faults in a system under test (SUT), said system comprising:
a dataflow model representative of error detection capabilities of the SUT; and
a reasoning engine associated with said dataflow model, said reasoning engine being adapted to evaluate test results corresponding to the SUT in relation to said dataflow model and identify faulty portions of the data transmission paths,
wherein said dataflow model is a directed graph including edges and vertices, each of said edges corresponding to at least a portion of a data transmission path of the SUT through which data packet transfer can occur and through which an error can be introduced, each of said edges being defined by two of said vertices.

17. The system of claim 16, wherein said reasoning engine is adapted to evaluate the test results of the SUT with respect to constraints, the constraints defining relationships of at least some of the portions of the dataflow model with respect to data packet flow through each data transmission path.

18. The system of claim 16, wherein said reasoning engine is adapted to receive information corresponding to failed data transfers and identify portions of the SUT potentially associated with the failed data transfers.

19. The system of claim 16, further comprising:
an SUT communicatively coupled to at least one of said dataflow model and said reasoning engine.

20. A system for diagnosing faults in a system under test (SUT), said system comprising:
means for receiving test results corresponding to portions of data transmission paths of the SUT; and
means for diagnosing the SUT with respect to constraints defining relationships of at least some of the portions of data transmission paths of the SUT with respect to data packet flow through the data transmission paths,
wherein said means for diagnosing includes means for analyzing the SUT with respect to a dataflow model representative of error-free behavior of the SUT and means for identifying faulty portions of the data transmission paths.

21. The system of claim 20, further comprising:
means for testing the SUT to generate test results.

22. A diagnosis system stored on a computer-readable medium, the diagnosis system being adapted to diagnose data packet transfer faults in a system under test (SUT), said diagnosis system comprising:
logic configured to identify portions of the data transmission paths of the SUT capable of introducing errors in data packet transfer;
logic configured to provide constraints defining relationships of at least some of the portions of the data transmission paths with respect to data packet flow therethrough; and
logic configured to diagnose the SUT with respect to the constraints,
wherein said logic configured to diagnose comprises:
logic configured to provide a dataflow model representative of error-free behavior of the SUT; and
logic configured to analyze the SUT with respect to a dataflow model and identify faulty portions of the data transmission paths.

23. The diagnosis system of claim 22, wherein said logic configured to diagnose includes logic configured to generate information indicative of the flow of data associated with a time of error detection.

24. The diagnosis system of claim 22, wherein said logic configured to diagnose includes logic configured to identify portions of the SUT potentially associated with failed data transfers.

25. The diagnosis system of claim 24, wherein said logic configured to diagnose includes logic configured to exonerate components initially identified as being associated with the failed data transfers.

* * * * *